United States Patent [19]
Van Uffelen

[11] 4,079,327
[45] Mar. 14, 1978

[54] SIGNAL TRANSITION DETECTOR

[75] Inventor: Jean-Pierre Van Uffelen, Chevilly Larue Rungis, France

[73] Assignee: Telecommunications Radioelectriques et Telephoniques T.R.T., Paris, France

[21] Appl. No.: 733,873

[22] Filed: Oct. 19, 1976

[30] Foreign Application Priority Data

Oct. 27, 1975 France .................. 75 32759

[51] Int. Cl.² .......................................... H03K 5/153
[52] U.S. Cl. ................................... 328/150; 307/354; 328/117
[58] Field of Search ............... 307/222, 231, 350, 354; 328/44, 109, 110, 114–119, 150, 127, 128

[56] References Cited
U.S. PATENT DOCUMENTS

| 3,223,851 | 12/1965 | Kitchens et al. | 328/150 X |
| 3,225,213 | 12/1965 | Hinrichs et al. | 307/354 X |

Primary Examiner—John Zazworsky
Attorney, Agent, or Firm—Frank R. Trifari; Henry I. Steckler

[57] ABSTRACT

This transition detector is intended to supply pulses which characterize the instants the signal passes a threshold. This signal, which appears in a rectangular form is applied to a first integrator which supplies a signal which increases or decreases in accordance with the sense of the rectangular signal and to a branch which comprises a series arrangement of a delay circuit and a second integrator which is identical to the first. The outputs of the two integrators are connected to a comparator which supplies the desired pulses. At least at the start, the output of the first integrator is entered in a store at a given instant and at an instant which is so much later as the delay supplied by the delay circuit the second integrator is forced to assume the value stored in the store.

4 Claims, 3 Drawing Figures

SIGNAL TRANSITION DETECTOR

The invention relates to a signal transition detector for producing output pulses indicative of the transitions of an alternating input signal through a given amplitude level, for instance positive and negative going transitions through zero amplitude. The invention relates more particularly to such a signal transition detector of a character comprising a comparator for comparing the amplitude of the input signal with a reference level to produce a rectangular signal whose sense (positive or negative) relative to a datum level corresponds to the sign of the difference between the input signal amplitude and the reference level, first integrating circuit means and means for feeding the rectangular signal to said first integrating circuit means to produce a first signal whose magnitude increases or decreases in accordance with the sense of said rectangular signal.

Such a transition detector has a particular application in the receiver of a data transmission system to synchronize a local clock of the receiver with transitions in a received data signal.

French Patent Specification No. 2,098,925 discloses such a transition detector of the above character in which the transitions in the input signal which coincide with the edges of the rectangular signal are detected as being the instants at which the first signal produced by the first integrating circuit means passes through zero. This known transition detector avoids, to some degree the detection of parasitic transitions caused by noise, for the integration is equivalent to filtering the received data signal to reduce the noise. In the prior art detector, however, the noise reduction is rather poor due to the integration period being dependent upon the phase shift between data signal and clock signal. This integrating period, and consequently the filtering are therefore variable and may even be reduced to zero. Another drawback of this prior art detector is that it only detects transitions for a limited shift between the data signal and the clock signal. To enable it to function with a greater shift an additional device is required to detect the absence of detected transitions and to control the phase of the clock signal so as to introduce the amount of phase shift required for correct functioning.

It is an object of the present invention to provide a signal transition detector which aims at an optimal noise filtering action, without significant limitation on the shift between the clock signal and the data signal.

According to the invention, a signal transition detector of the above character further comprises second integrating circuit means, delay means connected to feed a delayed version of said rectangular signal to said second integrating circuit means to produce a second signal the magnitude of which increases or decreases in accordance with the sense of said delayed version of the rectangular signal, a second comparator and means for applying said first and second signals to the second comparator to produce the desired output pulses in response to the magnitudes of the applied first and second signals being equal.

A transition detector according to the invention may be realised in digital form in which the integrating circuit means are comprised by respective up-down counters for counting clock pulses upwards or downwards in dependence on the sense of the particular rectangular signal applied thereto, a clock pulse generator supplying said clock pulses which are of a frequency which is relatively high compared with the average transition rate of the alternating input signal.

The following description, given by way of a non-limiting example with reference to the accompanying drawings, shows how the invention may be carried into effect. In the drawings.

Figure 1:
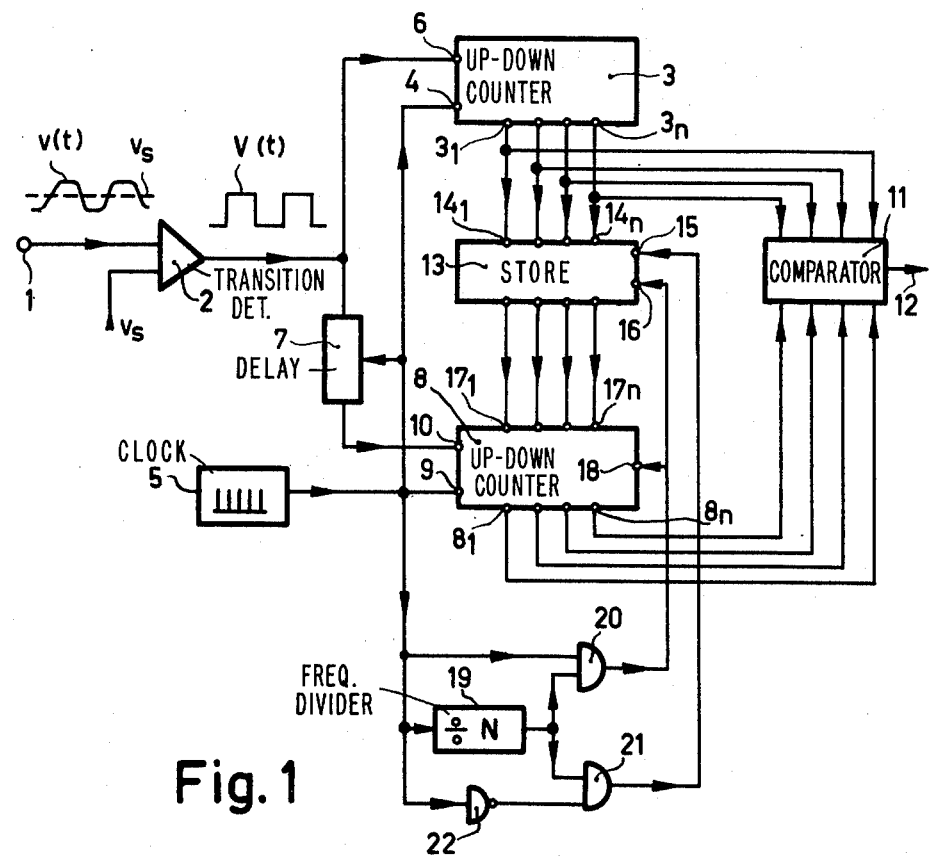
FIG. 1 is a circuit diagram of a transition detector according to the invention.

Referring to the drawings, in FIG. 1 an alternating input signal $v(t)$ is applied to an input terminal 1 of the transition detector shown in this Figure. It is assumed hereinafter that this input signal is a data signal received in a receiver. The transition detector is operable to produce output pulses which characterize the instants that the input signal $v(t)$ crosses a threshold level $v_s$. The terminal 1 is connected to one input of a first comparator 2, a second input of which is connected to receive a DC voltage representing the threshold level $v_s$. The output signal of the first comparator 2 is a rectangular signal $V(t)$ which has a positive or negative polarity (or sense) of value $+V$ or $-V$ depending on whether the difference between $v(t)$ and $v_s$ is positive or negative. The crossings (or transitions) of the signal $v(t)$ through the threshold level $v_s$ occur at the same instant as the edges of the rectangular signal $V(t)$.

The output of the first comparator 2 is connected to a first integrating circuit 3 which produces a first signal which increases or decreases in magnitude depending on whether the signal $V(t)$ has the value $+V$ or $-V$. With the detector of FIG. 1 realized in digital form, the first integrating circuit 3 is an up-down counter which receives at a clock input terminal 4 clock pulses of a frequency $1/\Delta t$ suppled by a clock pulse generator 5. These pulses are counted upward or downward depending on whether the signal $V(t)$ has the value $+V$ or $-V$, the signal $V(t)$ being applied to a control terminal 6 of the first integrating circuit 3. The frequency $1/\Delta t$ of the clock pulses is relatively high with respect to the reciprocal of the duration of an element of the signal $V(t)$. The content of the up-down counter forming the first integrating circuit 3 is a binary number whose $n$ bits are available at its output $3_1$ to $3_n$ and represent the magnitude of a first signal which is indicative of the transition rate of the input signal.

The rectangular signal $V(t)$ from the first comparator 2 is also fed to a delay circuit 7 which delays the signal by a period $\tau$. This delay circuit 7 has its output connected to a second integrating circuit 8 which is identical to the integrating circuit 3 and which produces a second signal the magnitude of which increases or decreases depending on whether the delayed version of the signal $V(t)$ has the value $+V$ or $-V$. In digital form, the delay circuit 7 is a shift register having N elements and is actuated by the clock pulses having the frequency $1/\Delta t$ from the generator 5 so that the delay produced by circuit 7 is equal to $N \cdot \Delta t$. The second integrating circuit 8 is an up-down counter which receives at a clock input terminal 9 the clock pulses from the generator 5 and which is controlled to count these pulses upward or downward depending on whether the delayed version of the rectangular signal $V(t)$, applied to its control terminal 10, has the value $+V$ or $-V$. The content of the up-down counter forming the second integrating circuit 8 is a binary number whose $n$ bits are available at its outputs $8_l$ and $8_n$ and represent the magnitude of a second signal which is indicative of the transition rate of the input signal.

The first and second signals, that is, the binary numbers available at the outputs $3_l$ and $3_n$ and $8_l$ and $8_n$ are applied to a second comparator 11 which produces desired output pulses at its output 12 when the magnitudes of the applied first and second signals are equal.

The operation of the transition detector is based on the following considerations:

the rectangular signal $V(t)$ produced by the comparator 2 can be written:

$$V(t) = \text{Sgn } [v(t) - v_s] \quad (1)$$

where Sgn means "sign of"

when calculating the integral of $V(t)$ during a constant time period $\tau$, this integral can be represented by the function:

$$F(t) = \int_{t-\tau}^{t} \text{Sgn } [v(t) - v_s] \, dt \quad (2)$$

It is possible to prove that the instant at which this function passes through zero occurs at instants which lag $\tau/2$ after transitions in the rectangular signal $V(t)$ and which can therefore be utilized as the instants which characterize these transitions.

Figure 2:
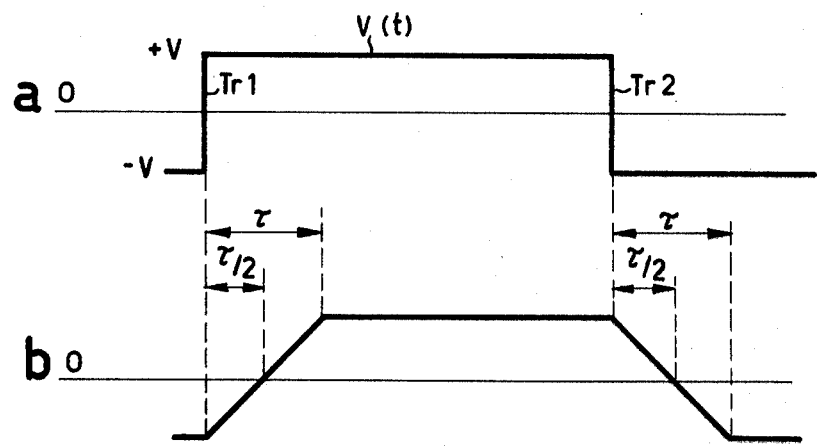
FIG. 2 shows waveform diagrams illustrating basic principles of the detector operation.

This is represented by FIG. 2 in which diagram 2a shows a portion of the signal $V(t)$ which may assume the values $+V$ or $-V$ and which comprises two transitions Tr1 and Tr2; and diagram 2b shows the function $F(t)$, defined by the formula (2), which is at zero magnitude at instants which are retarded $\tau/2$ with respect to the instants at which the transitions Tr1 and Tr2 are produced.

The transition detector operates by detecting the instants at which the function $F(t)$ defined by formula (2) becomes zero. It will be seen that in this manner the integration time of the signal $V(t)$ has a constant duration $\tau$ and this integration time may be chosen to correspond with an optimum filtering of the data signal received; for a data transmission at a rate 1/T the optimum duration of the integration is equal to T. This value corresponds to the minimum noise band if no introduction of interference between the symbols is desired.

The operations performed in the detector consider the function $F(t)$ as two functions: i.e.

$$F(t) = F_1(t) - F_2(t) \quad (3)$$

with $$\left. \begin{array}{l} F_1(t) = \int_{t=-\infty}^{t} \text{Sgn } [v(t) - v_s] \, dt \\[6pt] F_2(t) = \int_{t=-\infty}^{t} \text{Sgn } [v(t - \tau) - v_s] \, dt \end{array} \right\} \quad (4)$$

The function $F_1(t)$ corresponds to the integration of the signal Sgn $[v(t) - v_s]$, that is to say of the signal $V(t)$ supplied by the first comparator 2. The function $F_2(t)$ corresponds to the integration of the signal Sgn $[v(t - \tau) - v_s]$, that is to say of a signal $V(t - \tau)$ obtained at the output of the delay circuit 7 which delays the signal $V(t)$ for a period $\tau$.

For the detection of the transitions as the instants at which the function $F(t)$ becomes zero, it is sufficient, according to the formula (3) to detect the instants at which $F_1(t)$ equals $F_2(t)$. That is realized in the circuit diagram of FIG. 1 by the second comparator 11 which detects the digital equality of the first and second signals and which supplies a pulse each time the binary numbers representing these signals at the outputs of the up-down counters 3 and 8 are the same. Each of these pulses characterizes a transition of the data signal and as stated above occurs with a delay $\tau/2$ with respect to this transition.

The integrals determining the functions $F_1(t)$ and $F_2(t)$ will not be known exactly unless both up-down counters 3 and 8 have the same count, at least at the start of the operation of the transition detector. This can be achieved by resetting both up-down counters to zero count, but this is done only at the start of the operation of the transition detector.

In the circuit diagram of FIG. 1, the functions $F_1(t)$ and $F_2(t)$ are calculated in digital form by the up-down counters 3 and 8, respectively, which counters operate in a continuous manner without thereafter being reset at zero. The result of this integration is available at any moment, in the form of a binary number, at their outputs $3_l$ to $3_n$ and $8_l$ to $8_n$.

However, because the integrals which determine the functions $F_1(t)$ and $F_2(t)$ are the same except for one constant, it is necessary for the correct functioning of the detector to ensure that these two integrals are calculated using the same constant. This condition may be satisfied by making the function $F_2(t)$ take, at a given instant $t_2$ the value the function $F_1(t)$ had at a prior instant $t_1 = t_2 - \tau$. In FIG. 1 this is realized, by storing the value of the number at the output of the up-down counter 3 in a store 13 at an instant $t_1$ at which a write pulse is produced and by replacing the content of the up-down counter 8 by this value at an instant $t_2 = t_1 + \tau$ at which a read pulse is produced.

For this purpose the output terminals $3_l$ to $3_n$ of the up-down counter 3 are connected to input terminals $14_l$ to $14_n$ of the store 13. The binary number which is applied to the terminals $14_l$ to $14_n$ is written into the store 13 at the instant at which a write pulse appears at the terminal 15 of this store. Furthermore, the binary number contained in the store 13 is read out to be applied to terminals $17_l$ to $17_n$ of the up-down counter 8 at the instant at which a read pulse which lags the write pulse by a period of time $\tau$ appears at a terminal 16 of this store. This read pulse is simultaneously applied to a control terminal 18 of the up-down counter 8 to cause the latter to be set to a predetermined count which corresponds to the binary number applied to its terminals $17_l$ to $17_n$. It is sufficient that this sequence of the write and read pulses is produced once, when the detector is started. It is also possible to produce this sequence periodically.

For this latter purpose a frequency divider 19 divides the frequency $1/\Delta t$ of the pulses supplied by generator 5 by N and the output of this divider is arranged to supply pulses of a duration $\Delta t$ which consequently occur with the period $N\Delta t$. The read pulses are obtained at the output of an AND-gate 20 two inputs of which are connected to the output of the generator 5 and to the output of the frequency divider 19, respectively. The write pulses are obtained at the output of an AND-gate 21 two inputs of which are connected to the output of the generator 5 (by way of an invertor circuit 22) and to the output of the frequency divider 19 respectively. Write and read pulses are thus obtained having a duration $\Delta t/2$ and occurring at the frequency $1/N\Delta t$). A read pulse follows a write pulse and is separated from it by N periods $\Delta t$.

Figure 3:
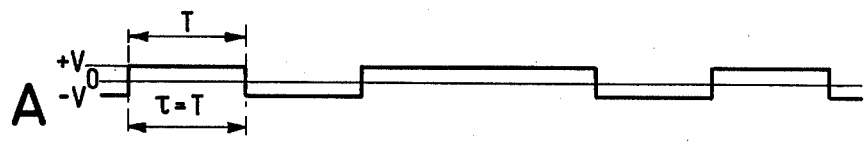
FIG. 3 shows further waveform diagrams illustrating the actual operation of the detector.
Figure 3:
Figure 3:
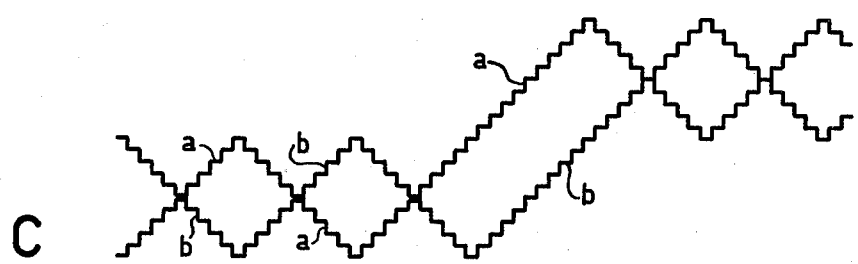
Figure 3:
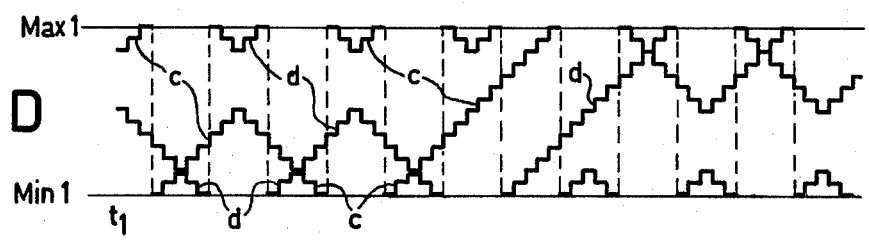
Figure 3:
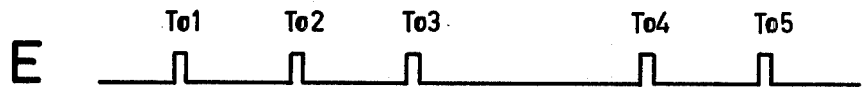

The waveform diagrams of FIG. 3 illustrate the operation of the transition detector of FIG. 1. The waveform diagram 3A shows the rectangular signal $V(t)$ occurring at the output of the first comparator 2. The elements of this rectangular signal have a duration T and assume the values $+V$ or $-V$. The waveform diagram 3B shows the rectangular signal $V(t)$ which occurs at the output of the delay circuit 7 and which has been delayed, for example, by a period $\tau$ which is equal to the duration T. In the waveform diagram 3C the stepped curve $a$ shows the first signal which occurs at the output of the up-down counter 3 has the result of the integration of the signal of waveform diagram 3A. The stepped curve $b$ in the waveform diagram 3C shows the second signal which occurs at the output of the up-down counter 8 as the result of the integration of the signal of waveform diagram 3B. The points where the first and second signal as represented by the curves $a$ and $b$ intersect characterize the transitions of the signal $V(t)$ of the waveform diagram 3A and occur with a delay of $\tau/2$ with respect to these transitions. The waveform diagram 3E shows the corresponding output pulses $To_1-To_5$ produced by the second comparator 11.

In the waveform diagram 3C it is assumed that the up-down counters 3 and 8 have a capacity such that their lower and upper counting limits are never reached.

A transition detector according to the invention may, however, operate with up-down counters of a limited capacity such that their lower and upper counting limits are reached, provided that this capacity exceeds the maximum number N of pulses which could be counted during the period $\tau$, which in the present embodiment is equal to T.

The waveform diagram 3D illustrates an example in which the counting capacity chosen for the up down counters 3 and 8 is equal to 3(N/2), the lower and upper counting limits then being 0 and 3N/2. The stepped curve $c$ represents the count of the counter 3. This curve which corresponds to the integral of the signal $/V(t)$ of waveform diagram 3A has at each instant the same slope as the curve $a$ of waveform diagram 3C but has discontinuities in some places. The reason for this is that when the extreme position 0 or 3N/2 of the counter is reached during the duration of an element of the rectangular signal $V(t)$, this counter is put into the other extreme position 3N/2 or 0. This type of operation is conventional for an up-down counter. The curve $d$ which represents the count of the counter 8 is produced in the same manner in response to the signal of waveform diagram 3B. The points at which curves $c$ and $d$ intersect occur at the same instants as those of curves $a$ and $b$ of waveform diagram 3C and characterize the transitions of the rectangular signal $V(t)$, as before.

What is claimed is:

1. A signal transition detector for producing output pulses indicative of the transitions of an alternating input signal through a given amplitude reference level, comprising a first comparator means for comparing the amplitude of the input signal with said given reference level and for producing a rectangular signal whose sense relative to a datum level corresponds to the sign of the difference between the input signal amplitude and the reference level, a first integrating circuit means coupled to said first comparator means for producing a first signal having a magnitude that changes in accordance with the sense of said rectangular signal, delay means coupled to said first comparator means for producing a delayed version of said rectangular signal, a second integrating circuit means coupled to said delay means for producing a second signal having a magnitude which changes in accordance with the sense of said delayed version of the rectangular signal, and a second comparator means coupled to said first and second integrating circuit means for receiving said first and second signals and for producing the desired output pulses in response to the magnitudes of the applied first and second signals being equal.

2. A signal transition detector as claimed in claim 1, wherein the first and second integrating circuit means each comprise respective up-down counter means for counting clock pulses upwards or downwards in dependence on the sense of the respective rectangular signal applied thereto, and further comprising a clock pulse generator means coupled to said up-down counter mean for supplying said clock pulses having a frequency which is relatively high compared with the average transition rate of the alternating input signal.

3. A signal transition detector as claimed in claim 2, wherein each up-down counter means comprises means for producing a first setting pulse on reaching its minimum count and for producing a second setting pulse on reaching its maximum count, said first setting pulse being applied to set the respective counter means to its maximum count, and said second setting pulse being applied to set the respective counter means to its minimum count.

4. A signal transition detector as claimed in claim 1, further comprising means coupled to both of said integrating circuit means for storing the value of the first signal at a given instant, and control means coupled to said storing means for transferring the stored value of said first signal to the second integrating circuit means after a time interval which is equal to the delay introduced by said delay means.

* * * * *